US008545237B2

(12) United States Patent  (10) Patent No.: US 8,545,237 B2
Johnson et al.  (45) Date of Patent: Oct. 1, 2013

(54) CONNECTOR FOR INTERCONNECTING CONDUCTORS OF CIRCUIT BOARDS

(75) Inventors: Lee A Johnson, Fargo, ND (US); Michael J. Zurn, Pelican Rapids, MN (US); Jon T. Jacobson, Fargo, ND (US); Dale A. Janssen, Fargo, ND (US)

(73) Assignee: Deere & Company, Moline, IL (US)

( * ) Notice: Subject to any disclaimer, the term of this patent is extended or adjusted under 35 U.S.C. 154(b) by 177 days.

(21) Appl. No.: 12/888,594

(22) Filed: Sep. 23, 2010

(65) Prior Publication Data

US 2012/0003847 A1  Jan. 5, 2012

Related U.S. Application Data

(60) Provisional application No. 61/359,947, filed on Jun. 30, 2010.

(51) Int. Cl.
*H01R 12/00* (2006.01)
(52) U.S. Cl.
USPC .......................................................... 439/75
(58) Field of Classification Search
USPC .................. 439/65, 66, 74, 75; 361/758, 804
See application file for complete search history.

(56) References Cited

U.S. PATENT DOCUMENTS

| | | | | |
|---|---|---|---|---|
| 3,148,356 A * | 9/1964 | Hedden, Jr. | | 365/55 |
| 3,596,138 A * | 7/1971 | Lehrfeld | | 361/785 |
| 4,381,134 A | 4/1983 | Anselmo et al. | | |
| 4,511,196 A * | 4/1985 | Schuler et al. | | 439/96 |
| 4,516,820 A * | 5/1985 | Kuzma | | 439/289 |
| 4,929,193 A | 5/1990 | Taylor | | |
| 5,158,470 A | 10/1992 | Zarreii | | |
| 5,286,218 A * | 2/1994 | Sakurai et al. | | 439/444 |
| 5,345,366 A * | 9/1994 | Cheng et al. | | 361/785 |
| 5,618,188 A * | 4/1997 | Gilmore et al. | | 439/91 |
| 5,825,633 A * | 10/1998 | Bujalski et al. | | 361/804 |
| 5,915,999 A | 6/1999 | Takenaka et al. | | |
| 5,975,914 A * | 11/1999 | Uchida | | 439/66 |
| 6,609,914 B2 * | 8/2003 | Dibene, II | | 439/74 |
| 6,618,268 B2 * | 9/2003 | Dibene et al. | | 361/787 |
| 6,623,279 B2 * | 9/2003 | Derian et al. | | 439/74 |
| 6,623,280 B2 * | 9/2003 | Oldenburg et al. | | 439/75 |
| 6,700,798 B2 * | 3/2004 | Ribeiro | | 361/804 |
| 6,733,318 B2 | 5/2004 | Myer et al. | | |
| 6,818,837 B2 * | 11/2004 | Okami | | 174/260 |

(Continued)

FOREIGN PATENT DOCUMENTS

DE  10159113  6/2003
DE  10159113 A1  6/2003

(Continued)

OTHER PUBLICATIONS

European Search Report Sep. 5, 2011, 3 pages.
Complaint Pin Connectors, Datasheet [online]. On Anon World Class Connectors. [retrieved on Apr. 7, 2010]. Retrieved from the Internet: <URL:http://www.onanon.com/cpin.htm>.
Electrical/Electronic Architecture. Delphi webpage. [online]. [retrieved on Apr. 7, 2010]. Retrieved from the Internet: <URL:http://delphi.com/manufacturers/auto/ee/connect/header-systems/compliant/>.

(Continued)

*Primary Examiner* — Neil Abrams
*Assistant Examiner* — Travis Chambers

(57) ABSTRACT

A connector comprises a generally cylindrical dielectric body with a central bore in the dielectric body. The dielectric body has a first end and second end opposite the first end. Conductors extend axially through the cylindrical dielectric body and are spaced apart from each other in a generally circular or elliptical arrangement. Each conductor comprises an embedded portion in the dielectric body and mating portions extending from the first end and the second end.

25 Claims, 4 Drawing Sheets

(56) References Cited

U.S. PATENT DOCUMENTS

| | | | |
|---|---|---|---|
| 7,175,480 B2* | 2/2007 | Yamashita | 439/733.1 |
| 7,466,562 B2* | 12/2008 | Gilliland et al. | 361/803 |
| 7,666,008 B2 | 2/2010 | Levante et al. | |
| 8,025,507 B2* | 9/2011 | Kim et al. | 439/79 |
| 8,079,848 B2* | 12/2011 | Yasumura et al. | 439/66 |
| 2002/0176229 A1 | 11/2002 | Derian et al. | |
| 2003/0092296 A1* | 5/2003 | Oldenburg et al. | 439/75 |
| 2004/0043644 A1* | 3/2004 | DiBene et al. | 439/74 |
| 2007/0087592 A1 | 4/2007 | Thomson | |
| 2010/0075548 A1 | 3/2010 | Sypolt et al. | |

FOREIGN PATENT DOCUMENTS

| | | |
|---|---|---|
| EP | 1147573 | 10/2001 |
| FR | 2830375 | 4/2003 |
| FR | 2830375 A1 | 4/2003 |

OTHER PUBLICATIONS

Compliant Pin / Press-Fit Pin Technology for Automotive. Interplex Industries Inc. Product Brochure [online]. [retrieved on Apr. 7, 2010]. Retrieved on the Internet: <URL:http://www.interplex.com/compliant/pressfit>.

Micro Action Pin Compliant-Pin Connectors, Tyco Eiectronics. Datasheet [online]. [retrieved on Apr. 7, 2010]. Retrieved from the Internet: <URL:http://www.tycoelectronics.com/documentation/whitepapers/pdf/micro_action_pin_1773452-3.pdf>.

Press-Fit Interconnect Technology, Interplex Industries, Inc. Product Brochure [online]. [retrieved on Apr. 7, 2010]. Retrieved on the Internet: <URL:www.interplex.com/.../$File/Press-Fit-Interconnect.pdf>.

European Search Report dated Mar. 9, 2012 (10 pages).

* cited by examiner

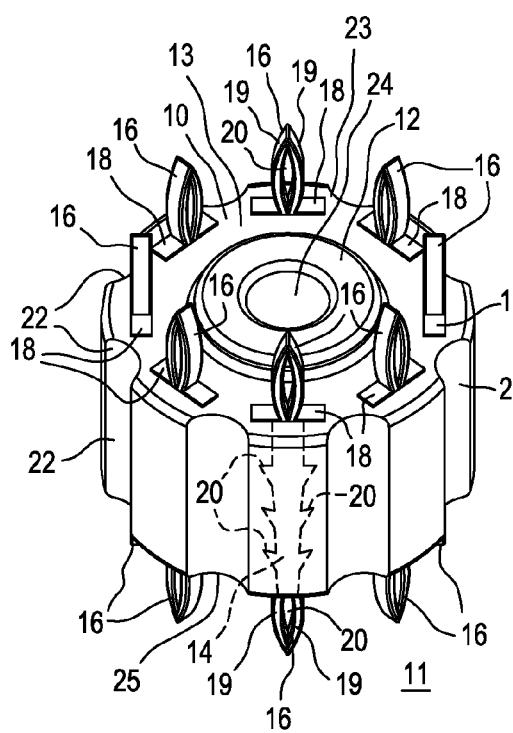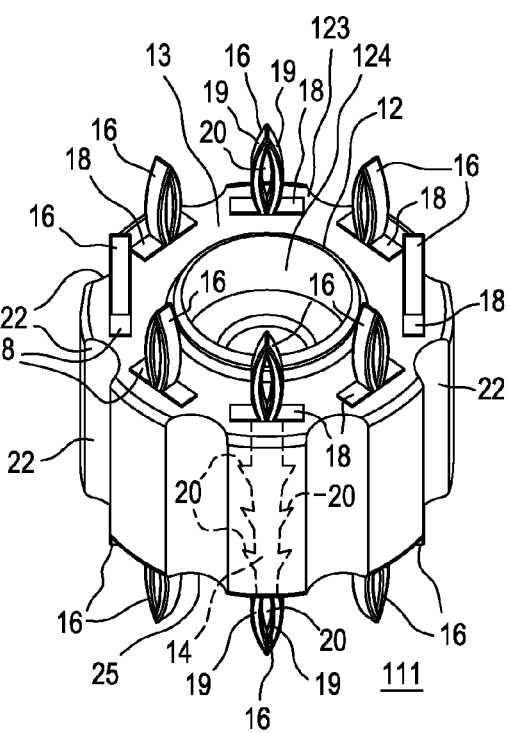
FIG. 1                    FIG. 2

CONNECTOR FOR INTERCONNECTING CONDUCTORS OF CIRCUIT BOARDS

This document (including the drawings) claims priority and the benefit of the filing date based on U.S. provisional application No. 61/359,947 filed Jun. 30, 2010 under 35 U.S.C. §119 (e), where the provisional application is hereby incorporated by reference herein.

FIELD OF THE INVENTION

This invention relates to a connector for interconnecting conductors of circuit boards.

BACKGROUND OF THE INVENTION

Certain prior art connectors for interconnecting conductors of circuit boards may have connector conductors that become dislocated or dislodged with respect to the connector body because of mechanical or vibrational stress, for example. Further, some prior art connectors may have inadequate mechanical connections to one or more circuit boards that do not properly secure the connector to the circuit board or that discourage mounting on circuit boards with spatial limitations. For the above reasons, there is a need for an improved connector for interconnecting conductors of circuit boards.

SUMMARY OF THE INVENTION

In accordance with one embodiment, a connector comprises a generally cylindrical dielectric body with a central bore in the dielectric body. The dielectric body has a first end and second end opposite the first end. Conductors extend axially through the cylindrical dielectric body and are spaced apart from each other in a generally circular or elliptical arrangement. Each conductor comprises an embedded portion in the dielectric body and mating portions extending from the first end and the second end.

BRIEF DESCRIPTION OF THE DRAWINGS

FIG. 1 is a perspective view of a first embodiment of a connector.

FIG. 2 is a perspective view of a second embodiment of the connector.

DESCRIPTION OF THE PREFERRED EMBODIMENT

Figure 3A:
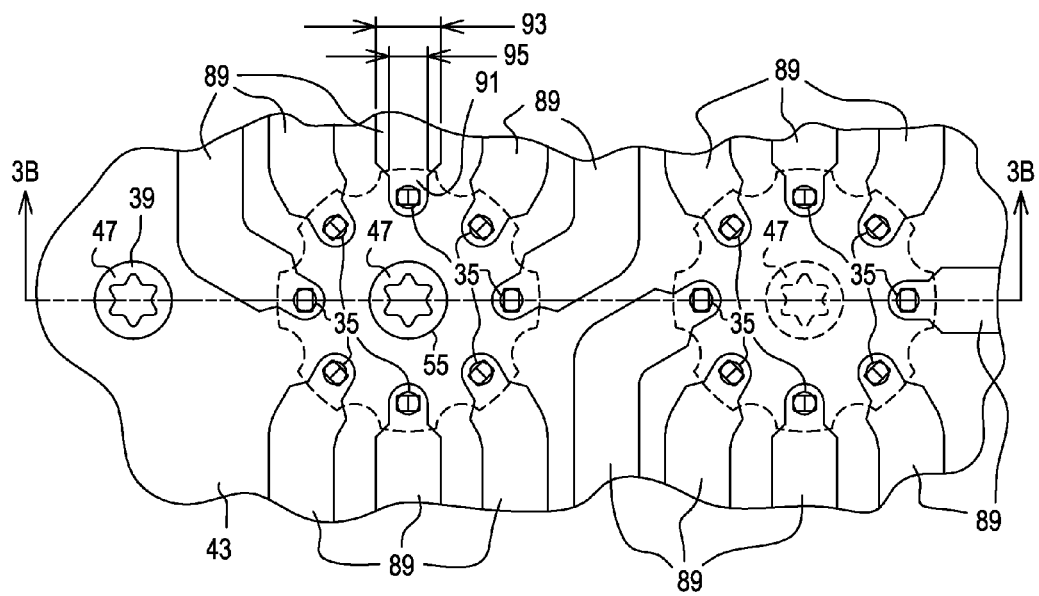
FIG. 3A is an illustrative example of a top view of a circuit board assembly that is associated with connectors in accordance with the invention.

In accordance with one embodiment of the invention, FIG. 1 discloses a connector 11. The connector 11 comprises a generally cylindrical dielectric body 10 and a central bore 24 in the dielectric body 10. As used in this document, "generally cylindrical" shall mean one or more of the following: (1) a cylindrical surface, (2) a polyhedral surface that approximates a cylindrical surface with at least five vertical faces or side faces, (3) a cylindrical surface with one or more notches, grooves or recesses in the exterior cylindrical surface, or (4) a polyhedral surface that approximates a cylindrical surface with at least five vertical faces or side faces, with one or more notches, grooves or recesses in the faces.

The dielectric body 10 has a first end 23 and second end 25 opposite the first end 23. As illustrated in FIG. 1, the dielectric body 10 has notches or grooves 22 (e.g., vertically extending grooves) to avoid mechanical interference with other electronic devices and components on the circuit board by minimizing the footprint or required mounting area of the connector 11.

Conductors 16 extend axially through the cylindrical dielectric body 10 and are spaced apart from each other in a generally circular or elliptical arrangement. Each conductor 16 comprises an embedded portion 14 in the dielectric body 10 and mating portions extending from the first end and the second end. The embedded portion 14 is illustrated as dashed lines in FIG. 1.

In one configuration, the embedded portion 14 has protrusions 20 or teeth for securing the conductor 16 within the body 10. The protrusions 20 or teeth anchor the conductors 16 within the body 10 to prevent the conductors 16 from being separated from the dielectric body 10 during removal (or connection) of the connector 11 from (or to) one or more circuit boards, for example. The protrusions 20 may be laterally extending barbs that point toward a shoulder 18 extending perpendicularly from the conductor and near a distal portion of each conductor. For example, the barbs face opposite to the direction of insertion of the conductors 16 into the dielectric body 10 during assembly of the connector 11.

The mating portion (e.g., 19) of the conductor may be configured in accordance with various configurations, that may be applied alternately or cumulatively. Under a first configuration, the mating portion comprises a compliant pin. Under a second configuration, the mating portion comprises a spring-loaded member for mating with a metallic through-hole 35 (e.g., in FIG. 3A) in a circuit board. Under a third configuration, the mating portion comprises two arched portions 19 that are joined together at opposite ends, the two arched portions 19 forming a generally elliptical hollow region 20. For example, the two arched portions 19 are subject to generally elastic deformation or elastic compression upon placement into a metallic through-hole 35 (e.g., in FIG. 3A) in a circuit board, and wherein a spatial span of a minor axis of the elliptical hollow region 20 is reduced. Under a fourth configuration, one mating portion has a shoulder 18 extending perpendicularly from the conductor 16. As shown in FIG. 1 and FIG. 2, the minor axis of the elliptical hollow region 20 is oriented generally transversely, whereas the major axis of the elliptical region 20 is oriented generally vertically and perpendicularly to the minor axis.

In one embodiment, a fastener 39 (in FIG. 3A) is inserted into the central bore 24 for fastening the dielectric body 10 to a circuit board (e.g., 45), such that one or more mating portions of the conductors 16 form electrical and mechanical interconnections with metallic or conductive through-holes 35 arranged in a generally circular pattern associated with conductive traces (e.g., 89 in FIG. 3A) of a circuit board. A generally elliptical arrangement or pattern includes a generally circular arrangement or pattern, for example. The fastener 39 may be retained by a retainer 41 (e.g. nut) that is separate from or integral with a housing, for instance. In a first example, the first end 23 comprises an elevated central surface 12 and an annular peripheral surface, where the elevated central surface 12 extends above the annular peripheral surface 13 to form a stop (or structural support) such that the mating portions of the conductors 16 can be properly seated in respective metallic through-holes 35. In a second example, the elevated central surface 12 extends above the annular peripheral surface 13 by an elevation selected to elastically deform the mating portions to a desired target level of deformation that assures a reliable mechanical and electrical interconnection. In a third example, the head 47 of the fastener 39 extends above the annular peripheral surface to form a stop such that the mating portions of the conductors 16 can be properly seated in respective metallic through-holes 35. In a fourth example, the head 47 extends above the annular peripheral surface 13 by an elevation selected to elastically deform the mating portions to a desired target level of deformation that assures a reliable mechanical and electrical interconnection.

The connector 111 of FIG. 2 is similar to the connector 11 of FIG. 1, except the connector of FIG. 2 includes a recessed central surface 124 instead of an elevated central surface 12. Like reference numbers indicate like elements in FIG. 1 and FIG. 2.

In the second embodiment, illustrated in FIG. 2, the first end 123 comprises a recessed central surface 124 or central recess for receiving a head 47 of a fastener 39 that is placed into the central bore 24 and an annular peripheral surface 13 around the recessed central surface 124. For example, the recessed central surface 124 may be countersunk to receive a fastener 39 such that the head 47 (e.g., its upper surface) of the fastener 39 is flush with or below the annular peripheral surface 13 upon assembly of the connector 11 or upon connection (e.g., electrical and mechanical connection) of the connector 11 to a printed circuit board. Here, the head 47 of the fastener 39 extends at or below the annular peripheral surface 13 to form a stop such that the mating portions of the conductors 16 can be properly seated in respective metallic through-holes 35. The head 47 extends at or below the annular peripheral surface 13 by an elevation selected to elastically deform the mating portions to a desired target level of deformation that assures a reliable mechanical and electrical interconnection.

FIG. 3A, FIG. 3B, FIG. 4 and FIG. 5 illustrate the connectors (11 or 111) of the first embodiment of FIG. 1 or the second embodiment of FIG. 2 installed in a circuit board assembly. Like reference numbers in any of the drawings indicate like elements.

FIG. 3A illustrates a top view of a circuit board assembly that is cut away. In FIG. 3A, a generally circular pattern of conductive through-holes 35 can support a geometry of metallic traces 89 that can increase in width with radial displacement from an axis of a clearance bore 55 in the circuit board (43 or 45) or the central bore 24 of the connector (11 or 111). The axis of the clearance bore 55 is generally perpendicular to the surface of the circuit board (43 or 45). The clearance bore 55 is located coaxially with the central bore 24 and is capable of receiving the fastener 39 with a clearance for its head 47 or top portion. In one embodiment, each conductive trace 89 that extends away from a corresponding conductive through hole 35, for receiving the conductors 16 of the connector (11 or 111), such that a first trace width 95 proximate to (e.g., surrounding) the conductive through hole 35 is less than a second trace width 93 of the same trace 89 at some radial distance from the axis of the clearance bore 55 in the circuit board or the central bore 24. For example, the conductive trace 89 has a wedge-shaped, generally triangular, or fan-shaped portion between a conductive through-hole section of the conductive trace 89 and another section of the conductive trace spaced 89 apart (e.g., radially) from the conductive through-hole section.

Accordingly, in certain configurations, the connector 11 or 111 supports or facilitates wider metallic traces (89) on at least one of the first circuit board (43 in FIG. 3B) and the second circuit board (45 in FIG. 3B) than if the conductive through-holes 35 were arranged in a generally rectangular pattern or in an array on a printed circuit board. Advantageously, the connector (11 or 111) with a generally circular or elliptical arrangement of conductors 16 is well-suited for use in conjunction with wider circuit board traces (e.g., 89) to increase the power handling or current capacity (e.g., amperage rating) of transmission lines formed by the conductive traces (e.g., 89), to allow the use of power semiconductors at lower operating voltages and higher current, or to facilitate impedance matching through micro-strip or other transmission line arrangements on single-sided or double sided substrates or circuit boards.

Figure 3B:
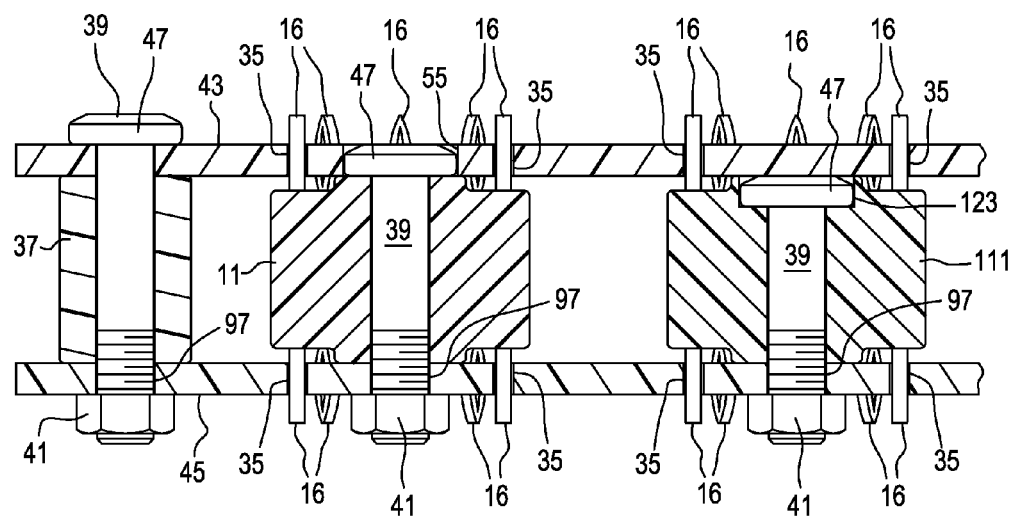
FIG. 3B is a cross-section of the circuit board assembly of FIG. 3A taken along reference line 3B-3B of FIG. 3A.

In FIG. 3B, the circuit board assembly comprises a first circuit board 43, a second circuit board 45, and connectors (11, 111). The first circuit board 43 and the second circuit board 45 each comprise a dielectric layer (e.g., a polymer, plastic, ceramic, or composite layer) with electrically conductive traces (89 in FIG. 3A) on one or more sides of the circuit board (e.g., 43, 45). The conductive traces 89 are used to electrically interconnect various electronic components or devices on the first circuit board 43, the second circuit board 45, or between the first circuit board 43 and the second circuit board 45. The traces 89 terminate in a group of conductive through-holes 35 or plated through holes that are configured to register with or align with the conductors 16 of the connectors (11 or 111). In one embodiment, the traces 89 terminate in a generally circular or elliptical pattern of through-holes 35, where each through-hole 35 is electrically connected to at least one corresponding trace on a circuit board (e.g., 43, 45). The fastener 39 is placed through a bore 97 in one circuit board (e.g., the second circuit board 45) and through the central bore 24 of the connector (11 or 111) to mechanically secure the connector (11 or 111) to the circuit board (e.g., second circuit board 45). The fastener 39 may support or facilitate alignment of the conductors 16 of the connectors (11 or 111) with the conductive through-holes 35 in one or more circuit boards (e.g., the first circuit board 43, the second circuit board 45, or both). The fastener 39 may be made of metal, an alloy or a dielectric material. The fastener 39 mates with a retainer 41, for example.

FIG. 3B illustrates certain differences between the connector 11 and the connector 111, as installed. On the left side of FIG. 3B, the connector 11 may require the first circuit board 43 to have a clearance bore 55 or opening of greater diameter or circumference that a head 47 of the fastener 39. Meanwhile, the connector 111 has a recess 123 for receiving the head 47 of the fastener 39, such that no clearance bore is required in the first circuit board 43.

As illustrated in FIG. 3B, the circuit board assembly may comprise one or more spacers 37 for spacing the first circuit board 43 and the second circuit board 45 apart by an amount consistent with the spacing provided by the connector 11, connector 111, or both. In one embodiment, the spacers 37 mechanically secure the first circuit board 43 to the second circuit board 45 for additional stability, where each spacer 37, and each circuit board (43, 45) has at least one bore (e.g., 97) for receiving a fastener 39. The fastener 39 mates with a retainer 41, for example. The spacers 37 may be generally cylindrical hollow members or may have other geometric shapes (e.g., rectangular or polygonal).

As illustrated in FIG. 1 and FIG. 2, the embedded portion 14 of the connector (11 or 111) has protrusions 20 or teeth for securing the conductor 16 within the body 10 to prevent dislodgement, dislocation, or misalignment from the dielectric body 10 during assembly or disassembly of the assembly. During insertion or removal of the conductors 16 into the corresponding conductive through-holes 35 of the circuit boards (e.g., 43, 45), the relative alignment of the dielectric body 10 to the conductors 16 is preserved, which supports proper alignment and engagement of the conductors 16 with the respective through-holes 35. Each of the mating portions of the conductors 16 comprises a spring-loaded member for mating with the corresponding conductive through-hole 35 in the first circuit board or the second circuit board. For example, each of the mating portions comprises two arched portions 19 that are joined together at opposite ends, where the two arched portions 19 form a generally elliptical hollow region 20.

In FIG. 3B, the two arched portions 19 may be subject to generally elastic deformation or elastic compression upon placement of the respective conductors 16 into the corresponding conductive through-holes 35 of the first circuit board 43 or the second circuit board 45, and wherein a spatial span of a minor axis of the elliptical hollow region 20 is reduced. The major and minor axes were previously defined in conjunction with FIG. 1 and FIG. 2.

Figure 4:
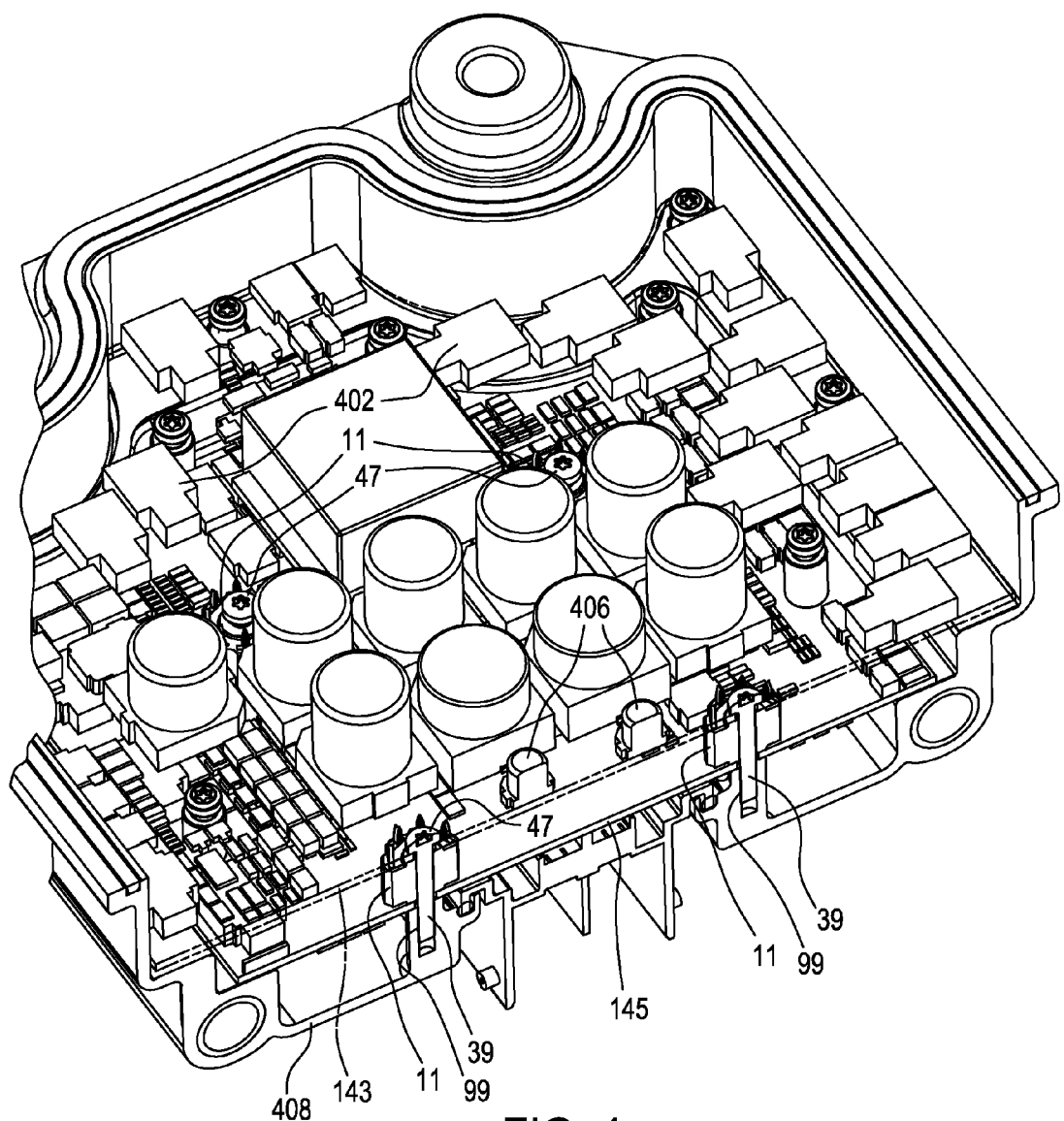
FIG. 4 is a perspective view of an electronic assembly that incorporates several connectors in accordance with the invention.
Figure 5:
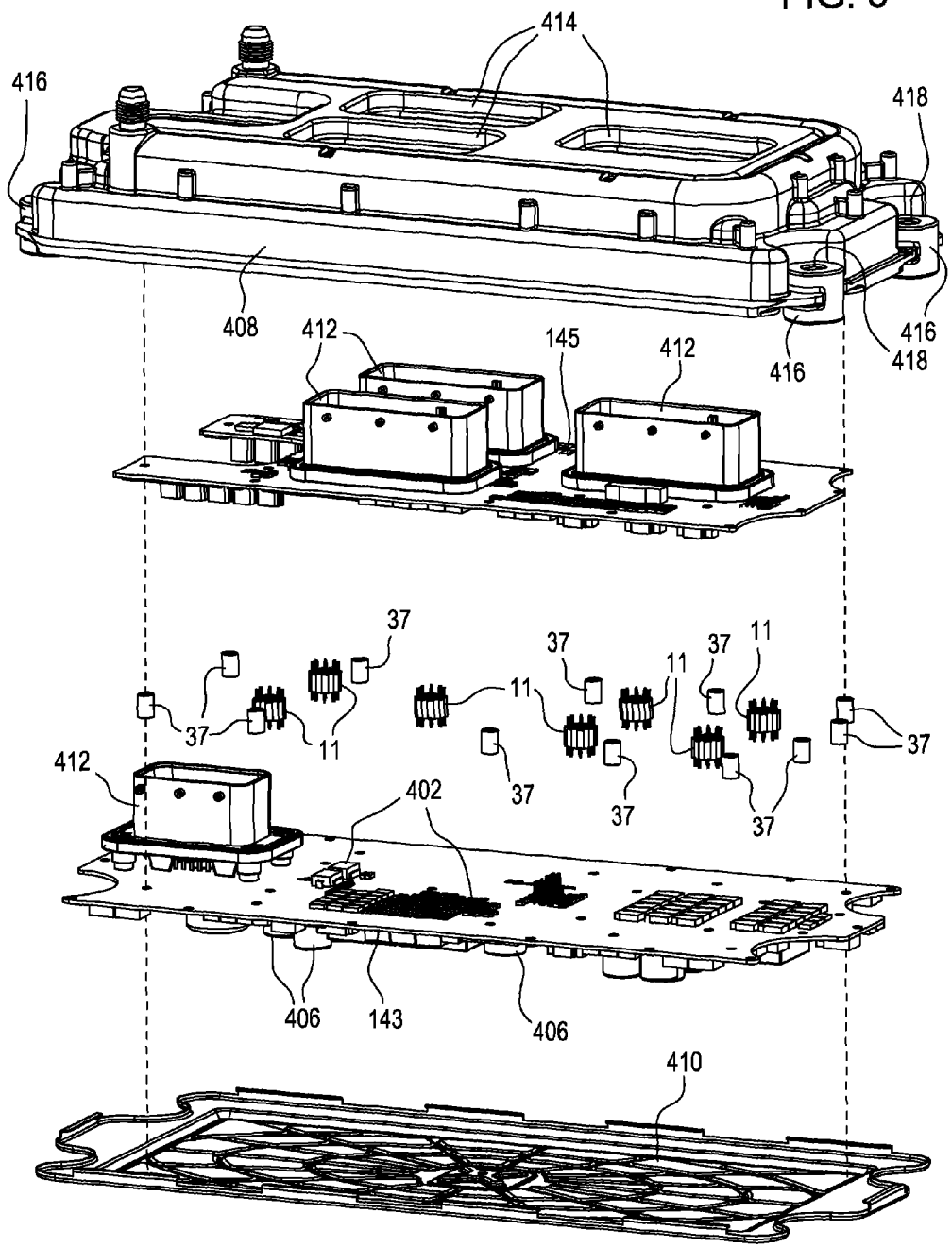
FIG. 5 is an exploded view of an electronic assembly of FIG. 4 that incorporates several connectors in accordance with the invention.

In FIG. 4 and FIG. 5 a circuit board assembly comprises a first circuit board 143 and a second circuit board 145 with first conductive traces and second conductive traces, respectively that terminate in a generally circular pattern of conductive through-holes that are spaced apart from each other. Like reference numbers in FIG. 1 through FIG. 5, inclusive, indicate like elements or features.

One or more connectors 11 are secured to a second circuit board 145 (e.g., or another circuit board, substrate or housing) via a fastener 39 and extend through a central bore 24 in a generally cylindrical dielectric body 10 of the connector 11. In one embodiment, the heads 47 of the fasteners are observable through clearance bores 55 (FIG. 3B) in the first circuit board 143 as shown in FIG. 4. In FIG. 4, the first circuit board 143 is shown in phantom to better reveal the cross section of the connectors 11 shown at the edge of the circuit boards (143, 145). The conductors 16 of the connectors 11 project through the first circuit board 143, such that at least a portion of the conductors 16 are visible from above the first circuit board 143. Various electronic components 402 and devices 406 are mounted on or associated with the circuit boards (143, 145). The first circuit board 143 and the second circuit board 145 are housed in a housing 408. The housing 408 may have threaded receptacles or other retainers 99 for retaining the fasteners 39.

The assembly of FIG. 5 is similar to that of FIG. 4, except FIG. 5 shows an exploded view of the assembly of FIG. 4 with the addition of cover 410.

The exterior of the housing 408 of FIG. 4 is oriented facing downward in FIG. 4, whereas the exterior of the housing 408 in FIG. 5 was oriented facing upward. The housing 408 may protect the circuit boards (143, 145) from the external environment and may provide thermal dissipation via an integral or separate heat sink. The cover 410 is secured or attached to the housing 408 by one or more fasteners, adhesives, or other technique for forming a mechanical connection. The second circuit board 145 has electrical connectors 412 on one side, which project through respective receptacles 414 or openings in the housing 408. The housing 408 may have bores 418 in mounting members 416 for mounting the assembly to a vehicle or another structure, for example.

The connectors 11 and spacers 37 are used to mechanically and electrically interconnect desired circuits, electronic components 402 and other devices 406 on each circuit board (143, 145) to one another in accordance with a schematic or circuit design. As illustrated in FIG. 5, the first circuit board 143 and the second circuit board 145 may comprise double-sided circuit boards with electronic components 402 and other devices 406 mounted on one or more sides and connected to electrically conductive traces (e.g., 89) on one or more sides. Accordingly, the connectors 11 support a wide configuration of possible circuits and schematics with enhanced mechanical stability, reliable electrical connections, and immunity to vibration associated with off-road vehicles, on-road vehicles, or otherwise.

Having described the preferred embodiment, it will become apparent that various modifications can be made without departing from the scope of the invention as defined in the accompanying claims.

The invention claimed is:

1. A connector comprising:
   a generally cylindrical dielectric body, a central bore in the dielectric body, the dielectric body having a first end and second end opposite the first end, where the first end and the second end comprise opposite faces of the dielectric body; and
   a plurality of conductors extending axially through the cylindrical dielectric body and spaced apart from each other in a generally circular or elliptical arrangement; each conductor comprising an embedded portion in the dielectric body and mating portions extending outward from the first end and the second end, wherein the embedded portion has jagged protrusions, or lagged teeth, for securing the conductors within the dielectric body, wherein each of the mating portions comprises a spring-loaded member for mating with a hole in a circuit board.

2. The connector according to claim 1 wherein the protrusions are laterally extending barbs that point toward a shoulder extending perpendicularly from the conductor and near a distal portion of each conductor.

3. The connector according to claim 1 wherein each of the mating portions comprises a compliant pin.

4. The connector according to claim 1 wherein each of the mating portions comprises a spring-loaded member for mating with a metallic through-hole in a circuit board.

5. The connector according to claim 1 wherein one of the mating portions has a shoulder extending perpendicularly from the conductor.

6. The connector according to claim 1 further comprising:
   a fastener inserted into the central bore for fastening the dielectric body to a circuit board, such that said one or more mating portions of the conductors form electrical and mechanical interconnections with metallic through-holes arranged in a generally circular pattern associated with conductive traces of a circuit board.

7. The connector according to claim 1 wherein the protrusions comprise barbs or barbed teeth.

8. The connector according to claim 1 wherein each of the mating portions comprises two arched portions that are joined together at opposite ends, the two arched portions forming a generally elliptical hollow region.

9. The connector according to claim 8 wherein the two arched portions are subject to generally elastic deformation or elastic compression upon placement into a metallic through-hole in a circuit board, and wherein a spatial span of a minor axis of the elliptical hollow region is reduced.

10. A connector comprising:
    a generally cylindrical dielectric body, a central bore in the dielectric body, the dielectric body having a first end and second end opposite the first end;

a plurality of conductors extending axially through the cylindrical dielectric body and spaced apart from each other in a generally circular or elliptical arrangement; each conductor comprising an embedded portion in the dielectric body and mating portions extending from the first end and the second end; and the first end comprising an elevated central surface and an annular peripheral surface, the elevated central surface extending above the annular peripheral surface to form a stop such that the mating portions of the conductors can be properly seated in respective metallic through-holes.

11. The connector according to claim 10 wherein the elevated central surface extends above the annular peripheral surface by an elevation selected to elastically deform the mating portions to a desired target level of deformation that assures a reliable mechanical and electrical interconnection.

12. A connector comprising:

a generally cylindrical dielectric body, a central bore in the dielectric body, the dielectric body having a first end and second end opposite the first end;

a plurality of conductors extending axially through the cylindrical dielectric body and spaced apart from each other in a generally circular or elliptical arrangement; each conductor comprising an embedded portion in the dielectric body and mating portions extending from the first end and the second end; and the first end comprising a recessed central surface for receiving a head of a fastener that is placed into the central bore and an annular peripheral surface around the recessed central surface, the head of the fastener extending above the annular peripheral surface to form a stop such that the mating portions of the conductors can be properly seated in corresponding metallic through-holes.

13. The connector according to claim 12 wherein the head extends above the annular peripheral surface by an elevation selected to elastically deform the mating portions to a desired target level of deformation that assures a reliable mechanical and electrical interconnection.

14. A circuit board assembly comprising:

a first circuit board with first conductive traces that terminate in a generally circular or elliptical pattern of conductive through-holes that are spaced apart from each other;

a connector secured to the first circuit board via a fastener extending through a central bore in a generally cylindrical dielectric body of the connector, the dielectric body having a first end and second end opposite the first end, where the first end and the second end comprise opposite faces of the dielectric body;

a plurality of conductors extending axially through the cylindrical dielectric body and spaced apart from each other; each conductor comprising an embedded portion in the dielectric body and mating portions extending outward from the first end and the second end, wherein the embedded portion has jagged protrusions, or jagged teeth, for securing the conductors within the dielectric body; and a second circuit board with second conductive traces that terminate in a generally circular or elliptical pattern of conductive through-holes that are spaced apart from each other, wherein each of the mating portions comprises a spring-loaded member for mating with a hole in a circuit board.

15. The circuit board assembly according to claim 14 further comprising a hole in the second circuit board to provide clearance for a head of the fastener to project through the hole.

16. The circuit board assembly according to claim 14 wherein each of the mating portions comprises a compliant pin.

17. The circuit board assembly according to claim 14 wherein each of the mating portions comprises a spring-loaded member for mating with the corresponding conductive through-hole in the first circuit board or the second circuit board.

18. The circuit board assembly according to claim 14 wherein the generally circular pattern of conductive through holes supports wider metallic traces on at least one of the first circuit board and the second circuit board than if the conductive through holes were arranged in a generally rectangular pattern or an array.

19. The circuit board assembly according to claim 14 wherein the protrusions comprise barbs or barbed teeth.

20. The circuit board assembly according to claim 14 further comprising one or more spacers for spacing the first circuit board and the second circuit board apart by an amount consistent with the spacing provided by the connector.

21. The circuit board assembly according to claim 16 wherein said one or more spacers each comprise a generally cylindrical hollow member for receiving a fastener for securing the first circuit board to the second circuit board.

22. The circuit board assembly according to claim 14 wherein each of the mating portions comprises two arched portions that are joined together at opposite ends, the two arched portions forming a generally elliptical hollow region.

23. The circuit board assembly according to claim 22 wherein the two arched portions are subject to generally elastic deformation or elastic compression upon placement into the conductive through-hole of the first circuit board or the second circuit board, and wherein a spatial span of a minor axis of the elliptical hollow region is reduced.

24. The circuit board assembly according to claim 14 wherein a conductive trace extends away from each corresponding conductive through hole, for receiving the conductors of the connector, such that a trace width surrounding the conductive through hole is less than the trace width of the same trace at some radial distance from the axis perpendicular to the central bore.

25. The circuit board assembly according to claim 24 wherein the conductive trace has a wedge-shaped, generally triangular, or fan-shaped portion between a conductive through-hole section of the conductive trace and another section of the conductive trace spaced apart from the conductive through-hole section.

* * * * *